United States Patent [19]

Matsumoto et al.

[11] Patent Number: 5,323,033
[45] Date of Patent: Jun. 21, 1994

[54] SINGLE CHIP IC DEVICE HAVING GATE ARRAY OR MEMORY WITH GATE ARRAY AND PROVIDED WITH REDUNDANCY CAPABILITY

[75] Inventors: Miki Matsumoto, Ohme; Hiroshi Kawamoto, Kodaira, both of Japan

[73] Assignee: Hitachi, Ltd., Tokyo, Japan

[21] Appl. No.: 921,962

[22] Filed: Aug. 4, 1992

Related U.S. Application Data

[63] Continuation of Ser. No. 654,678, Feb. 13, 1991, abandoned.

[30] Foreign Application Priority Data

Feb. 14, 1990 [JP] Japan .................. 2-33428

[51] Int. Cl.⁵ ............................................. H01L 27/02
[52] U.S. Cl. .................................. 257/209; 257/210; 257/211

[58] Field of Search ................... 357/45, 51; 257/207–211; 365/200

[56] References Cited

U.S. PATENT DOCUMENTS

| | | | |
|---|---|---|---|
| 4,668,972 | 5/1987 | Sato et al. | 357/45 |
| 4,970,686 | 11/1990 | Naruke et al. | 357/51 |
| 4,974,048 | 11/1990 | Chakravorty et al. | 357/45 |
| 5,166,556 | 11/1992 | Hsu et al. | 307/202.1 |

*Primary Examiner*—J. Carroll
*Attorney, Agent, or Firm*—Antonelli, Terry, Stout & Kraus

[57] ABSTRACT

The present invention disposes a redundancy logic device and a redundancy line which are used selectively in place of a logic device or a line, which becomes unusable, in a logic portion of a semiconductor integrated circuit device such as a gate array integrated circuit.

21 Claims, 12 Drawing Sheets

SINGLE CHIP IC DEVICE HAVING GATE ARRAY OR MEMORY WITH GATE ARRAY AND PROVIDED WITH REDUNDANCY CAPABILITY

This application is a continuation of application Ser. No. 07/654,678 filed on Feb. 13, 1991 abandoned.

BACKGROUND OF THE INVENTION

This invention relates to a semiconductor integrated circuit device and to a technique which will be particularly effective when utilized for defects of a logic portion of a gate array integrated circuit or the like having logic gate circuits and memories, for example.

A gate array integrated circuit device having a large number of logic gate circuits is known. A memory equipped with a logic function which includes random access memories formed as a macro-cell and a logic portion for executing predetermined logical calculation processing for the stored data of the memories is also known.

The memory equipped with the logic function is described, for example, in "Digest Of Technical Papers", ISSCC, dated Feb. 15, 1989, Session II, pp. 26-27.

In the conventional logic integrated circuit device such as the memory equipped with the logic function as described above, the logic portion comprising the combination of a plurality of logic gate circuits is not provided with a redundancy for defect relief. Therefore, if abnormality occurs in any of the logic gate circuits or connection lines, the logic integrated circuit device is rejected as being a defective product and the production yield of the logic integrated circuit device drops. This problem becomes even more severe as the scale of the logic integrated circuit device becomes significantly increased and particularly when memories that are equipped with the defect relief function are mounted to the logic integrated circuit device. That is, the effect of the defect relief function thereof is spoiled. The present inventors examined a system employing a majority logic function by multiplexing the logic portion itself, for example, in order to cope with this problem however, this system cannot be practically implemented when the scale of the logic portion is great and its construction is complicated.

SUMMARY OF THE INVENTION

It is an object of the present invention to provide a semiconductor integrated circuit device such as a logic integrated circuit device which can relieve abnormality of logic gate circuits or connection lines constituting a logic portion.

It is another object of the present invention to improve the production yield of a semiconductor integrated circuit device or the like and to promote the reduction of its production cost.

The above and other objects and novel features of the present invention will become more apparent from the following description when taken in conjunction with the accompanying drawings.

A brief description of some of the improved aspects of the invention disclosed in this application follows.

Namely, a redundancy logic device and a redundancy line which are used selectively in place of defective logic elements and lines are disposed in the logic portion of a semiconductor integrated circuit device such as a gate array integrated circuit and a memory equipped with a logic function.

According to the means described above, defective logic elements and defective connection lines resulting during the fabrication process of the gate array integrated circuits, or the like, are replaced by the redundancy logic element or the redundancy line and, therefore, normality of the function of the logic portion can be maintained. As a result, the production yield of the gate array integrated circuit or the like can be improved and the reduction of its production cost can be promoted.

DESCRIPTION OF THE PREFERRED EMBODIMENTS

Embodiment 1

Figure 1:
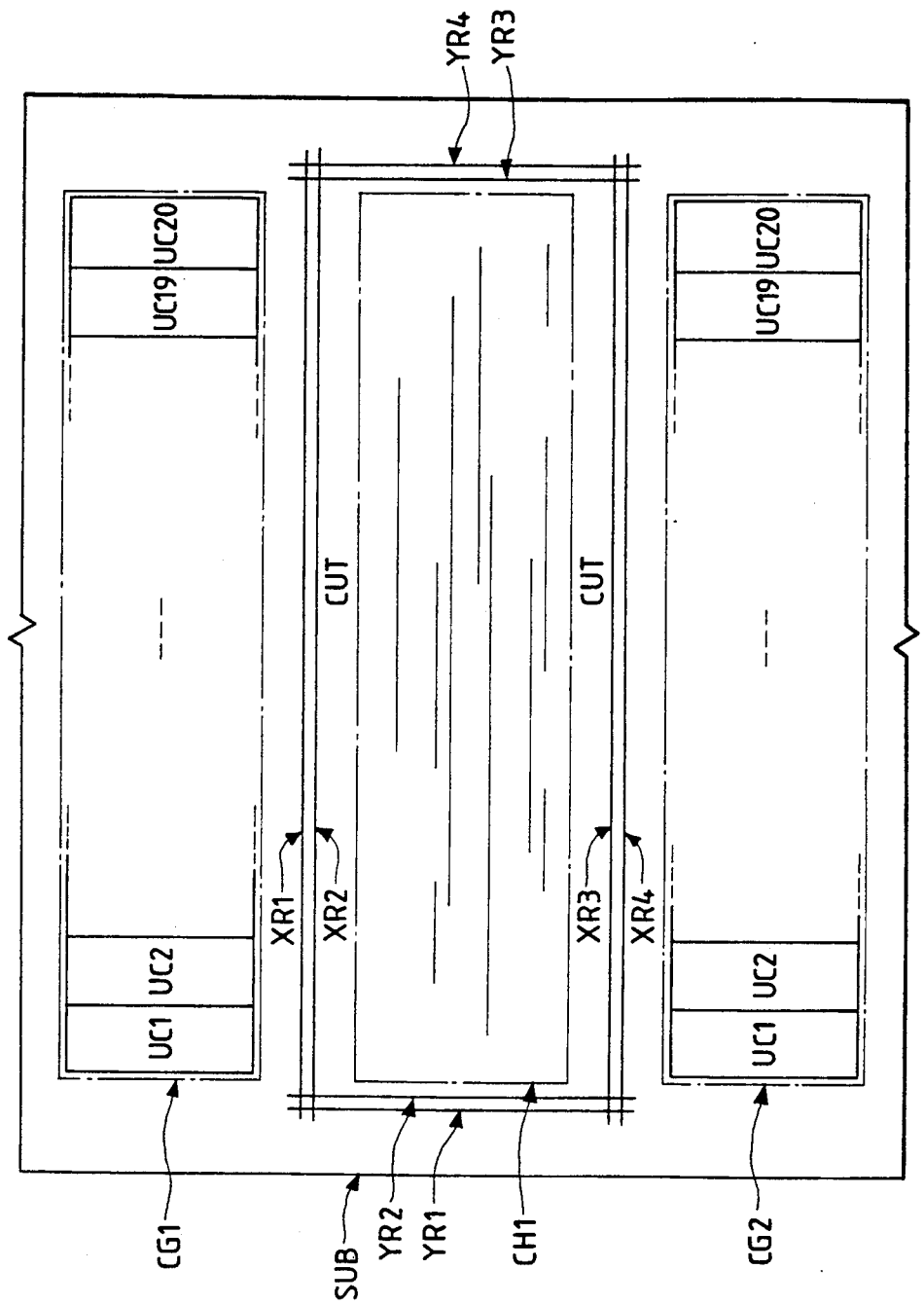
FIG. 1 is a partial enlarged arrangement view showing a first embodiment of a gate array integrated circuit to which the present invention is applied.
Figure 2:
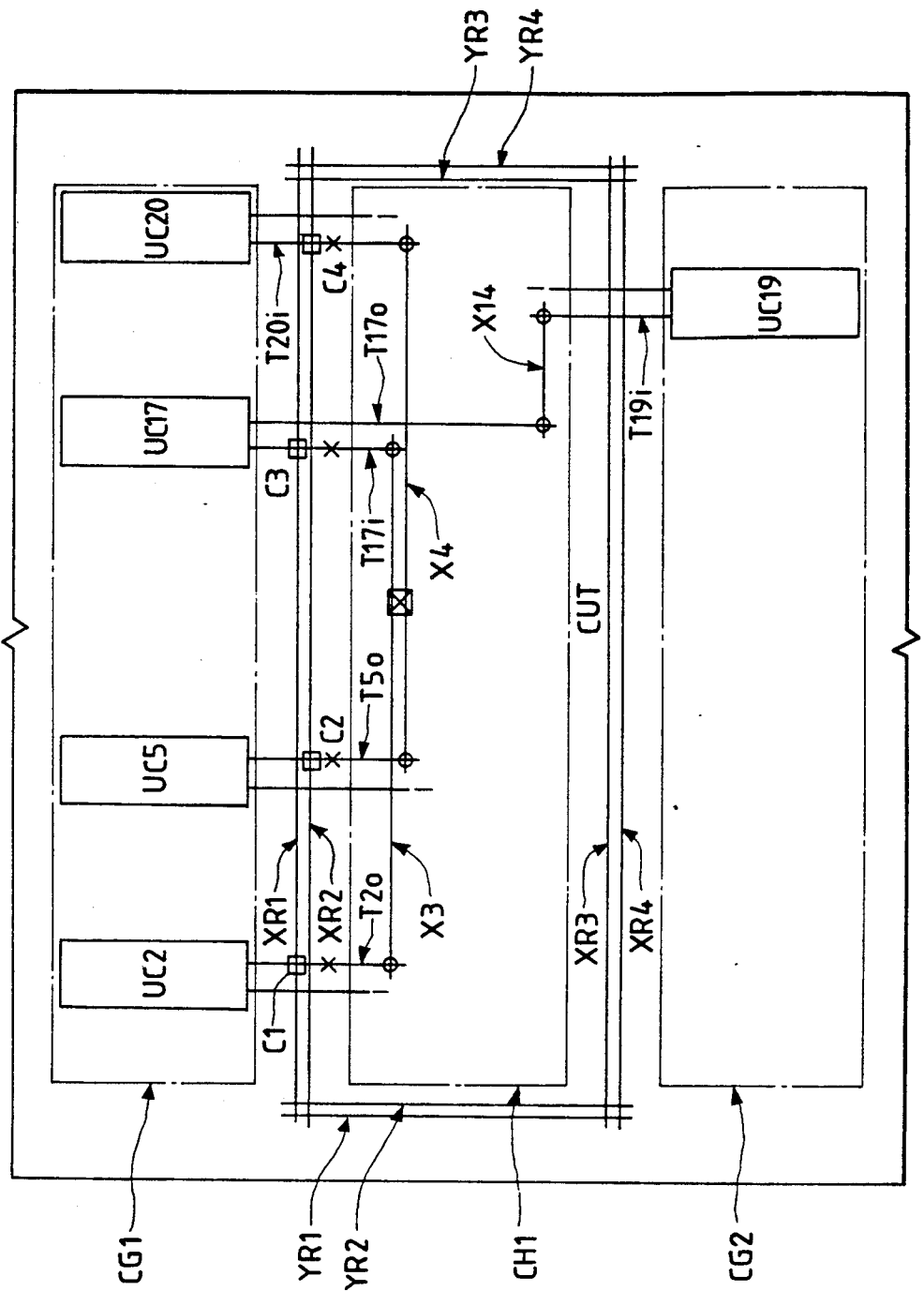
FIG. 2 is a wiring diagram showing an example of defect relief in the gate array integrated circuit shown in FIG. 1.
Figure 3:
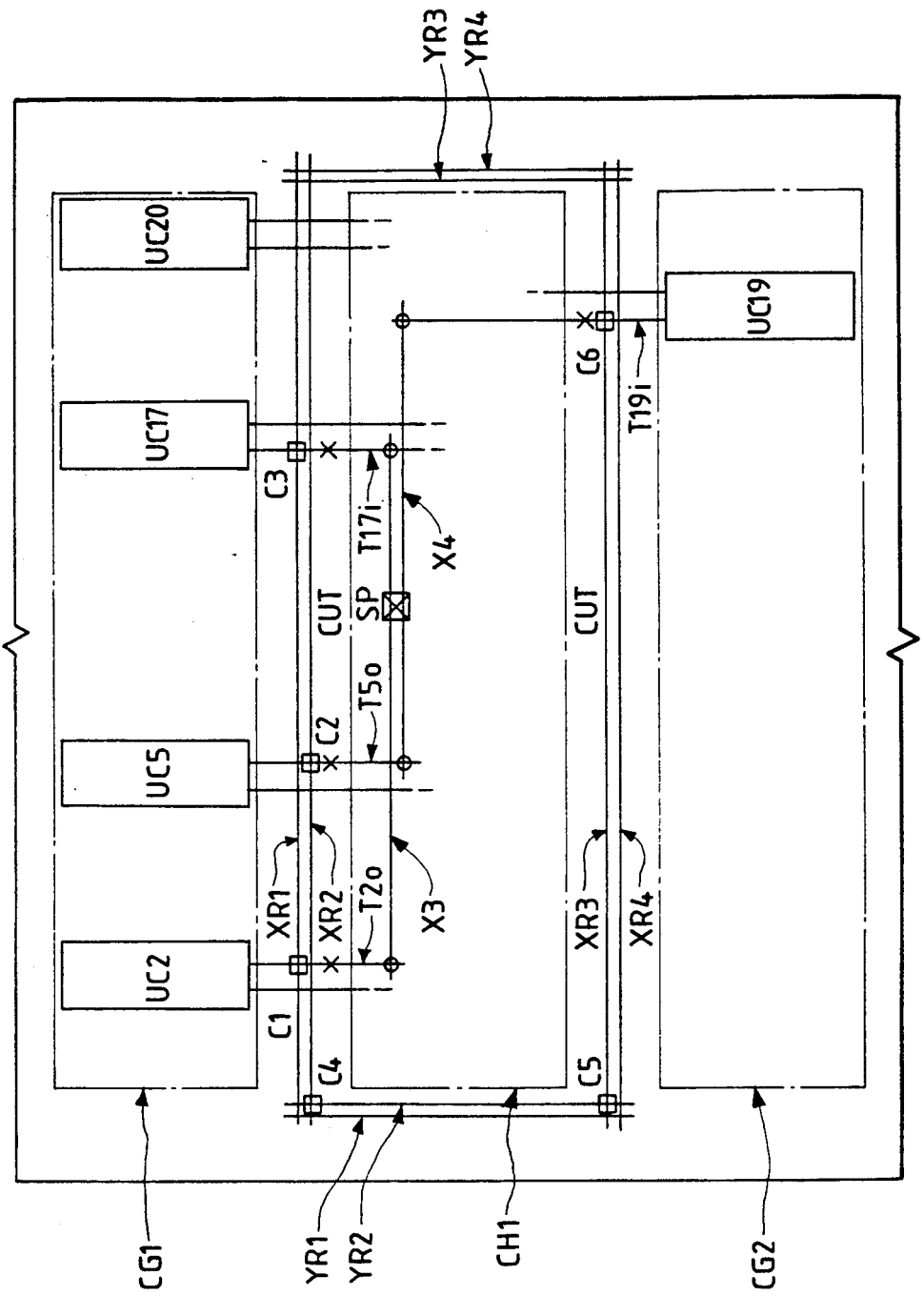
FIG. 3 is a wiring diagram showing another example of defect relief in the gate array integrated circuit shown in FIG. 1.
Figure 13:
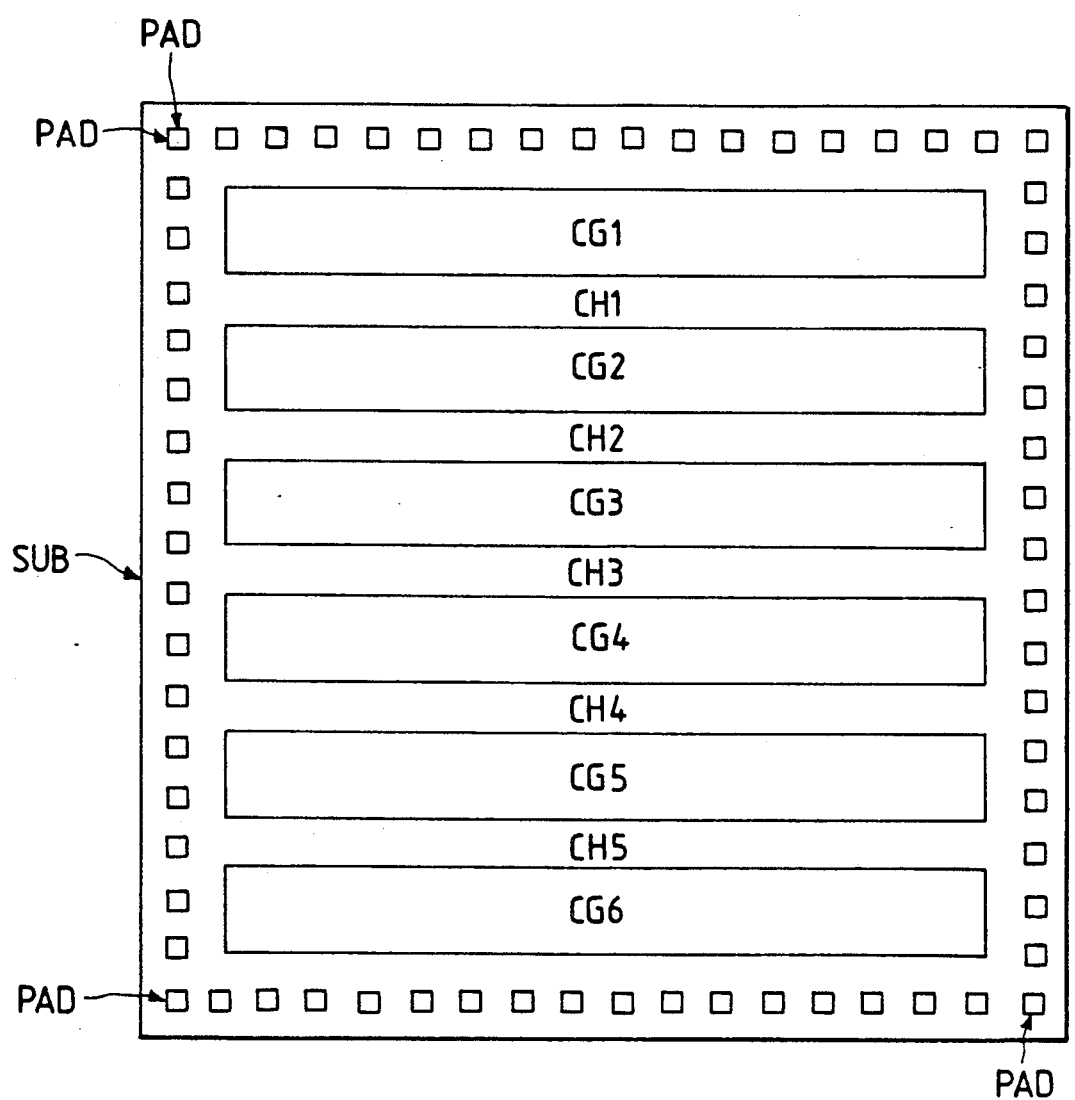
FIG. 13 is a substrate arrangement view showing a first embodiment of the gate array integrated circuit to which the present invention is applied.

FIG. 13 is a substrate arrangement view of a first embodiment of the gate array integrated circuit to which the present invention is applied, and FIG. 1 is its partial enlarged arrangement view. FIG. 2 is a wiring diagram for explaining an example of defect relief in the gate array integrated circuit shown in FIG. 1 and FIG. 3 shows a wiring diagram for explaining another example. The construction of the gate array integrated circuit of this embodiment, the outline of defect relief and its characterizing features will be explained with reference to these drawings. Incidentally, each circuit device shown in FIGS. 1 to 3 and circuit devices constituting each block in FIG. 13 are formed on one semiconductor substrate such as a p-type single crystal silicon by known fabrication technique of semiconductor integrated circuits.

In FIG. 13, the gate array integrated circuit of this embodiment includes six device regions CG1–CG6 that are disposed on the main plane of a semiconductor substrate SUB with predetermined distances between them. Logic devices such as CMOS (complementary MOS) logic gate circuits are primarily formed in these device regions.

A plurality of bonding pads PAD are arranged in alignment around the peripheral portions of the device regions CG1–CG6 in such a manner as to correspond to external terminals for input and output, and the portions between the adjacent device regions are used as wiring (channel) regions CH1–CH5 for forming primarily connection lines.

As typically represented by the device regions CG1 and CG2 in FIG. 1, twenty logic devices or in other words, unit cells UC1–UC20, are formed in the device regions CG1–CG6, respectively. As described already, these unit cells are employed to constitute a CMOS logic gate circuit consisting of P-channel and N-channel MOSFETs (metal oxide semiconductor field effect transistors: the term MOSFET will be used to represent generically the insulated gate field effect transistors in this specification), and its input and output terminals are extended into the corresponding wiring regions CH1–CH5 through outgoing lines that are formed in the vertical direction of the drawing, that is, in the Y-axis (first coordinate axis) direction.

As represented typically by the wiring region CH1 shown in FIG. 1, each wiring region CH1–CH5 is equipped with the Y channel which is assumed in the vertical direction of the drawing, or in other words, in the Y-axis direction (first channel) and the X channel (second channel) which is assumed in the horizontal direction, or in other words, in the X-axis direction (second direction). As will be described later, the Y channel of each wiring region among them is composed of a first layer metal wiring layer, that is, an aluminum wiring layer AL1 and is used as the outgoing line corresponding to the input terminal or output terminal of each unit cell as described above. The X channel is composed of a second layer metal wiring layer, that is, an aluminum wiring layer AL2, which is a higher level layer than the aluminum wiring layer AL1 described above, and is used as the line between the devices for connecting a plurality of outgoing lines corresponding to a plurality of logic gate circuits to be connected logically.

In this embodiment, a pair of redundancy lines XR1 and XR2 and a pair of redundancy lines XR3 and XR4 (first redundancy lines) extending in the X-axis direction are disposed between the two device regions CG1, CG2–CG5, CG6 corresponding to wiring regions CH1–CH5 as shown typically in FIG. 1. These redundancy lines are formed in the crossing form so as to include the corresponding wiring regions CH1–CH5 or in other words, so as to be capable of being connected easily to a series of outgoing lines corresponding to 20 unit cells UC1–UC20. These redundancy lines cross further two pairs of redundancy lines YR1, YR2 and YR3, YR4 (second redundancy lines) formed in the Y-axis direction at their both end portions, respectively.

Relatively great empty spaces, that is, cut regions CUT, are disposed between the redundancy lines XR1, XR2 and XR3, XR4 and the corresponding wiring regions CH1–CH5, respectively. In this embodiment, those input terminal and output terminal outgoing lines which are connected to unusable lines inside each wiring region are cut by use of FIB (Focused Ion Beam) or laser CVD (Chemical Vapor Deposition) technique and are further coupled to the corresponding redundancy lines as will be described later. Since the cut regions CUT are disposed between each wiring region and the corresponding redundancy lines in this manner, the cut processing of the input terminal or output terminal outgoing lines connected to the unusable lines becomes easy and can be made correctly.

Here, the outline of the wiring defect relieving method in the gate array integrated circuit of this embodiment will be described about the case shown in FIG. 2.

In FIG. 2, when no abnormality is observed in the gate array integrated circuit, the output terminal outgoing line T2o of the unit cell UC2 of the device region CG1 is connected to the X channel X3 of the wiring region CH1 through the contact represented by small circle o and further to the input terminal outgoing line T17i of the unit cell UC17 of the same device region CG1 through a similar contact. The output terminal outgoing line T17o of this unit cell UC17 is connected to the input terminal outgoing line T19i of the unit cell UC19 of the device region CG2 forming the pair through the X channel X14. Similarly, the output terminal outgoing line T5o of the unit cell UC5 of the device region CG1 is connected to the X channel X4 of the wiring region CH1 and further to the input terminal outgoing line T20i of the unit cell UC20 of the same device region CG1.

If any abnormality occurs during the fabrication process of the gate array integrated circuit and the short-circuit trouble represented by mark    occurs between the X channels X3 and X4 of the wiring region CH1, for example, the output terminal outgoing lines T2o and T5o and the input terminal outgoing lines T17i and T20i are cut off in the cut regions CUT by FIB or laser CVD and the cut-off processing of the unusable X channels X3 and X4 is conducted. Then, a new contact C1 represented by mark □ is formed between the output terminal outgoing line T2o and the redundancy line XR1 corresponding to the unit cell UC2 and the output terminal outgoing line and redundancy line are connected. The redundancy line XR1 is connected to the input terminal outgoing line T17i corresponding to the unit cell UC17 further through a new contact C3. Similarly, the output terminal outgoing line T5o corresponding to the unit cell UC5 is connected to the redundancy line XR2 through a new contact C2 and further to the input terminal outgoing line T20i corresponding to the unit cell UC20 through a new contact C4. As a result, the trouble of the gate array integrated circuit resulting from the short-circuit trouble between the X channels X3 and X4 is restored and normality of the function of the gate array integrated circuit can be therefore maintained.

Incidentally, as is obvious from the description given above, each redundancy line is disposed with two wirings being a unit and has a pair wiring form in the gate array integrated circuit of this embodiment. Accordingly, the short-circuit trouble of the adjacent lines which has a relatively high probability of occurrence can be easily remedied. Since the redundancy lines XR1-XR4 are disposed in the crossing arrangement so that they can be connected easily to all the input terminal and output terminal outgoing lines corresponding to each device region, the defect of all the logic devices contained in each device region can be relieved efficiently. Since FIB or laser CVD is employed for the cut-off and connection processing of the outgoing lines and the like, defect relief of the gate array integrated circuit or the like that has already been fabricated on the wafer as a semi-finished product becomes possible and the yield of products can be improved remarkably.

Another example of defect relief of the connection lines in the gate array integrated circuit of this embodiment will be explained about the case of FIG. 3.

In FIG. 3, if no abnormality is observed in the gate array integrated circuit, the output terminal outgoing line T2o of the unit cell UC2 of the device region CG1 is connected to the input terminal outgoing line T17i of the unit cell UC17 through the X channel X3 of the wiring region CH1 in the same way as in FIG. 1. The output terminal outgoing line T5o of the unit cell UC5 is connected to the X channel X4 of the unit cell UC5 and then to the input terminal outgoing line T19i of the unit cell UC19 of the device region CG2.

If any abnormality occurs in the fabrication process of the gate array integrated circuit and if, for example, the short-circuit trouble occurs between the X channels X3 and X4 of the wiring region CH1 as represented by mark ⊠, the output terminal outgoing lines T2o and T5o and the input terminal outgoing lines T17i and T19i are first cut in the corresponding cut regions CUT by FIB or laser CVD and the cut-off processing of the unusable X channels X3 and X4 is conducted. Then, a new contact represented by mark □ is formed between the output terminal outgoing line T2o and the redundancy line XR1 corresponding to the unit cell UC2 and such output terminal outgoing line and redundancy line are connected. The redundancy line XR1 described above is connected to the input terminal outgoing line T17i corresponding to the unit cell UC17 through a new contact C3. On the other hand the output terminal outgoing line T5o corresponding to the unit cell UC5 is connected to the redundancy line XR2 through a new contact C2. This redundancy line XR2 is connected to the redundancy line YR2 through a new contact C4 and further to the input terminal outgoing line T19i corresponding to the unit cell UC19 through the redundancy line YR2, the contact C5, the redundancy line XR3 and the contact C6. As a result, the trouble of the gate array integrated circuit resulting from the short-circuit trouble of the X channels X3 and X4 is remedied and normality of its function can be maintained.

As is obvious from the description given above, the redundancy lines YR1-YR4 in the Y-axis direction are disposed in this embodiment on both sides of each wiring region in such a manner as to cross and to be capable of being connected to the redundancy lines XR1, XR2 and XR3, XR4. Therefore, defect relief of the lines between the devices that are formed in substantially the two device regions becomes possible.

As described above, the gate array integrated circuit of this embodiment is equipped with the device regions CG1-CG6 and the wiring regions CH1-CH5 disposed between these device regions. Among them, the device regions CH1-CG6 include twenty unit cells UC1-UC20 consisting of the CMOS gate circuit, respectively, and the wiring regions CH1-CH5 include a plurality of Y channels which are formed in the Y-axis direction and are used as the input terminal or output terminal outgoing lines of each unit cell and a plurality of X channels which are formed in the X-axis direction and are used as the wirings between the devices. In this embodiment, two pairs of redundancy lines XR1, XR2 and XR3, XR4 which are formed so as to cross the input terminal or output terminal outgoing lines of the twenty corresponding unit cells and to be capable of being connected to them are disposed in the X-axis direction and furthermore, two pairs of redundancy lines YR1, YR2 and YR3, YR4 are formed in such a manner as to cross, and to be capable of being connected, to the redundancy lines described above. The predetermined cut regions CUT are disposed between the redundancy lines XR1 and XR2 and between XR3 and XR4 corresponding to each wiring region, respectively. The lines that become unusable in each wiring region due to the short-circuit trouble, or the like, are cut off as the associated outgoing lines are cut off in the corresponding cut regions CUT and are further connected to the suitable redundancy lines XR1-XR4 or YR1-YR4 through the new contacts that are formed by FIB or laser CVD. In this manner, abnormality occurring in the wiring region is restored and normality of function of the gate array integrated circuit can be maintained. As a result, the yield of products of the gate array integrated circuit is improved and the reduction of the production cost is promoted.

Embodiment 2

Figure 4:
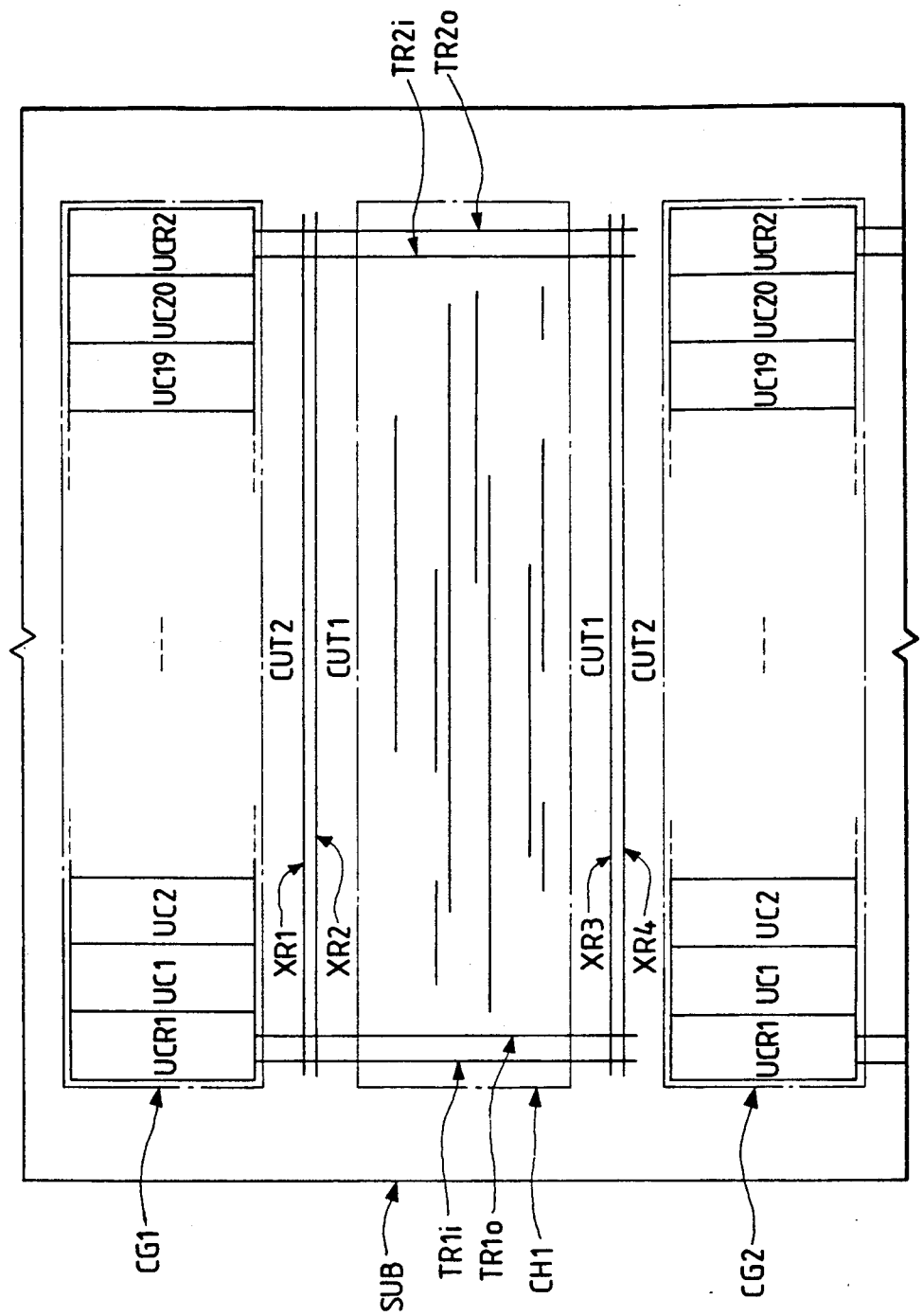
FIG. 4 is a partial enlarged arrangement view showing a second embodiment of a gate array integrated circuit to which the present invention is applied.
Figure 5:
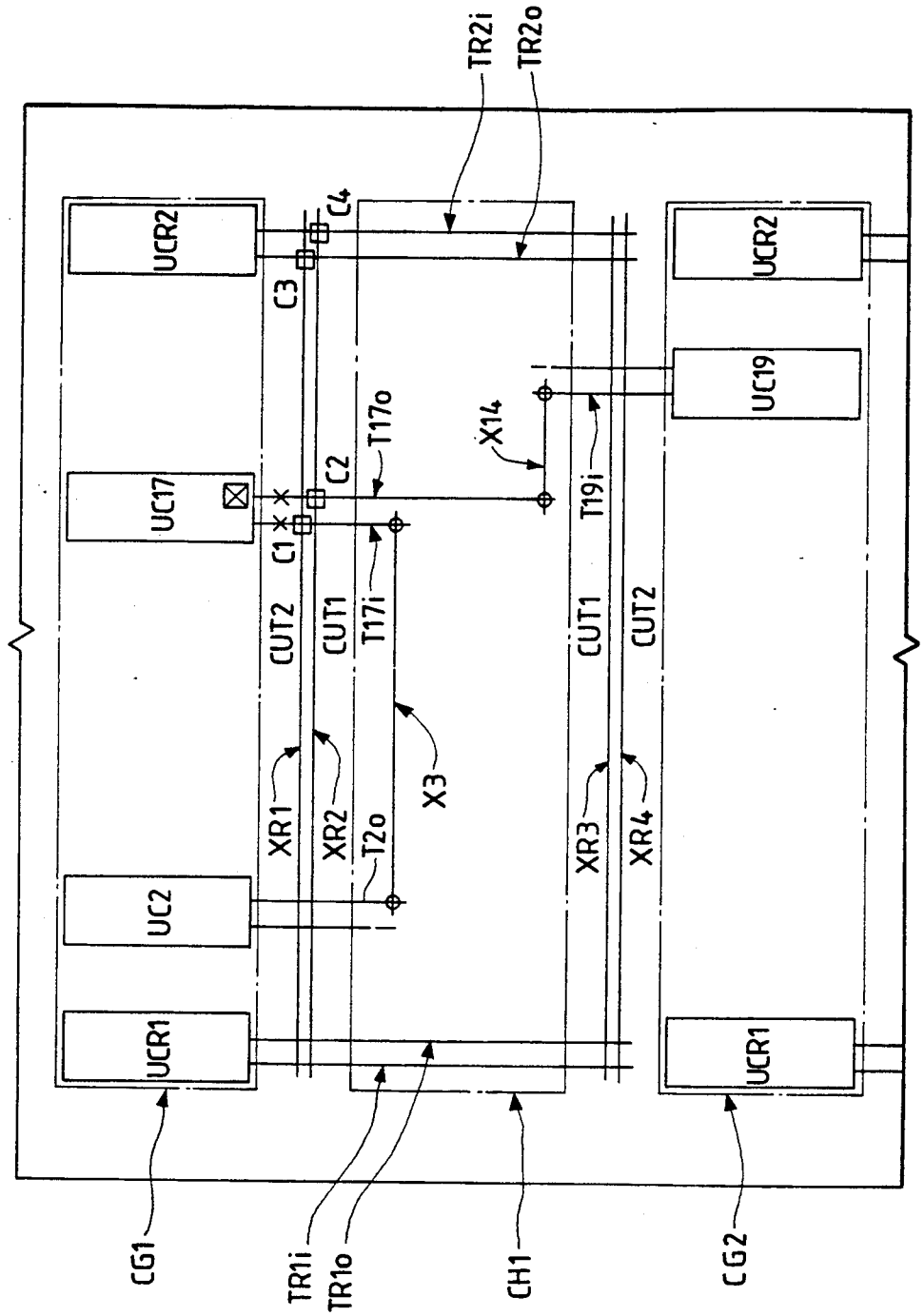
FIG. 5 is a wiring diagram showing an example of defect relief in the gate array integrated circuit shown in FIG. 4.
Figure 6:
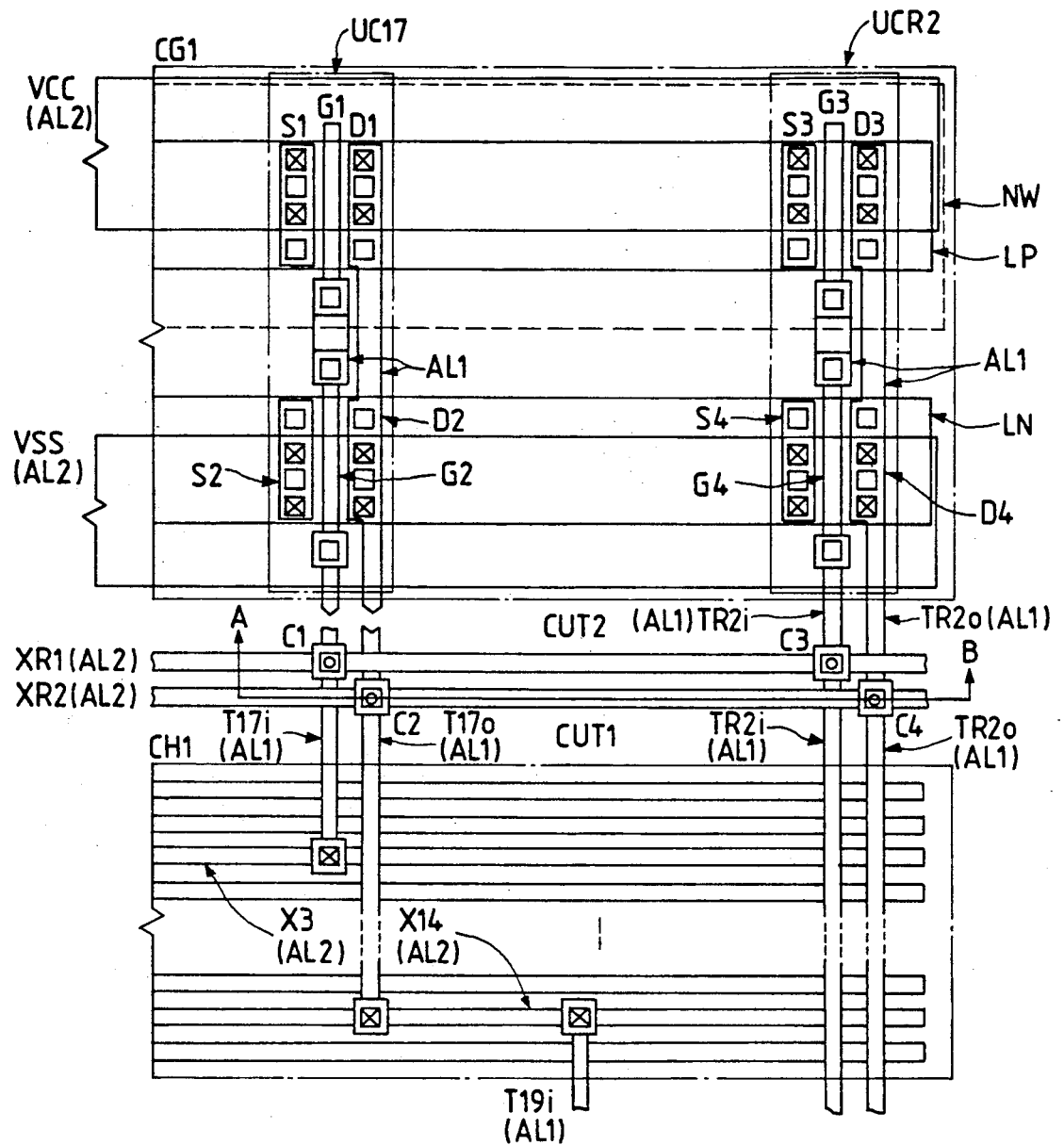
FIG. 6 is a partial device arrangement view showing one embodiment of the gate array integrated circuit shown in FIG. 4.
Figure 7:
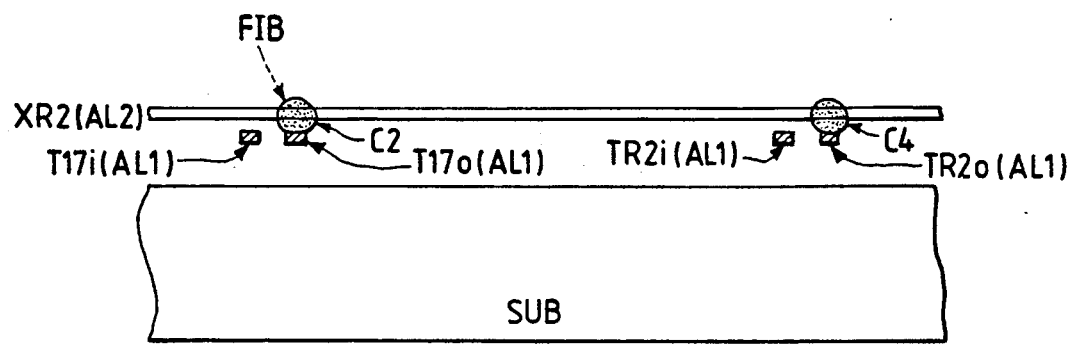
FIG. 7 is a partial substrate sectional view showing one embodiment of the gate array integrated circuit shown in FIG. 4.
Figure 8:
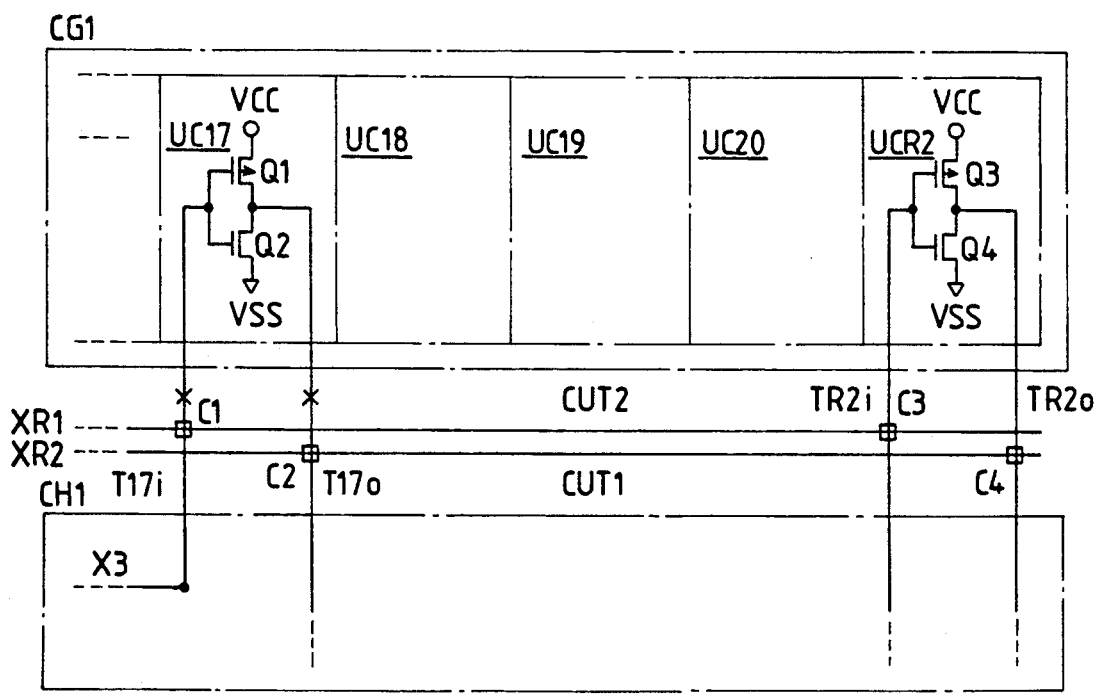
FIG. 8 is a partial circuit diagram showing a first embodiment of a redundancy logic device contained in the gate array integrated circuit shown in FIG. 4 and its peripheral portions.

FIG. 4 is a partial enlarged arrangement view of the second embodiment of the gate array integrated circuit to which the present invention is applied and FIG. 5 is a wiring diagram useful for explaining an example of defect relief in this gate array integrated circuit. FIG. 6 is a partial device arrangement view of the gate array integrated circuit of FIG. 4 and FIG. 7 is a sectional view taken along line A - B of FIG. 6. Furthermore, FIG. 8 is a partial circuit diagram of an embodiment of the redundancy logic devices contained in the gate array integrated circuit shown in FIG. 4, that is, the redundancy cells, and the peripheral portions. The construction of the gate array integrated circuit of this embodiment, the outline of its defect relief and its characterizing features will be explained with reference to these drawings. Incidentally, since the substrate arrangement diagram of the gate array integrated circuit of this embodiment is the same as that of the first embodiment shown in FIG. 13, the explanation on the substrate arrangement will be omitted. In the following circuit diagrams, MOSFETs having arrow put to their channel (back gate) portions are of the P-channel type and are distinguished from N-channel MOSFETs not having an arrow.

In FIG. 4, each of the six device regions CG1-CG6 disposed in the gate array integrated circuit of this embodiment includes twenty unit cells UC1-UC20 consisting of the CMOS logic gate circuit and two redundancy logic devices, that is, the redundancy cells UCR1 and UCR2, disposed at their both ends as represented typically by the device regions CG1 and CG2. The input terminal and output terminal of the unit cells UC-1–UC20 of each device region are extended into the corresponding wiring regions CH1–CH5 through the outgoing lines which are formed in the vertical direction of the drawing, that is, in the Y-axis direction (first coordinates axis) and the input terminals and output terminals of the redundancy cells UCR1 and UCR2 are extended into the corresponding wiring regions CH1–CH5 through the similar input terminal outgoing lines TR1i, TR2i and output terminal outgoing lines TR1o, TR2o, respectively.

Each wiring region CH1–CH5 is equipped with the Y channel (first channel) which is assumed in the vertical direction of FIG. 4, that is, in the Y-axis direction and the X channel (second channel) which is assumed in the horizontal direction, that is, in the X-axis direction (second coordinates axis). Among them, the Y channel of each wiring region is composed of the first layer aluminum wiring layer AL1 and is used as the input terminal or output terminal outgoing line corresponding to each unit cell or redundancy cell, as described already. The X channel is composed of the second layer aluminum wiring layer AL2 and is used as the wiring between the devices for connecting a plurality of outgoing lines corresponding to a plurality of logic gate circuits which are to be connected logically.

A pair of redundancy lines XR1, XR2 or XR3, XR4 (first redundancy lines) formed in the X-axis direction are disposed between the two device regions CG1, CG2–CG5, CG6 corresponding to the wiring regions CH1–CH5. The redundancy lines are disposed in the cross form in order to include the corresponding wiring regions CH1–CH5 or in other word, in such a manner that they can be connected easily to a series of outgoing lines corresponding to the twenty unit cells UC1–UC20 and the two redundancy cells UCR1 and UCR2.

The cut region CUT1 is disposed between each pair of redundancy lines XR1, XR3 and XR3, XR4 and the corresponding wiring region CH1–CH5 and a similar cut region CUT2 is respectively disposed between each pair of regions CG1–CG5 and between each pair of redundancy lines XR3, XR4 and the corresponding device regions CG2–CG6. In this embodiment, the input terminal or terminal outgoing lines connected to the lines that become unusable in each wiring region are cut in the cut regions CUT1 as will be described later and are further connected to the corresponding redundancy lines. The input terminal or output terminal outgoing lines connected to the logic devices which become unusable in each device region are cut in the cut region CUT2 and are further connected to the corresponding redundancy lines. The cutting and connecting processing of these outgoing lines is accomplished by FIB or laser CVD in the same way as in the first embodiment described above.

Now, the outline of the defect relief method of the logical devices in the gate array integrated circuit of this embodiment will be described about the case shown in FIG. 5.

In FIG. 5, when abnormality is not observed in the gate array integrated circuit, the output terminal outgoing line T2o of the unit cell UC2 of the device region CG1 is connected to the X channel X3 of the wiring region CH1 through the contact represented by small circle o and further to the input terminal outgoing line T17i of the unit cell UC17 of the same device region CG1 through a similar contact. The output terminal outgoing line T17o of this unit cell UC17 is connected to the X channel X14 of the wiring region CH1 and further to the input terminal outgoing line T19i of the unit cell UC19 of the device region CG2 forming the pair.

Incidentally, the unit cell UC17 of the device region CG1 is formed as a CMOS inverter circuit as shown typically in FIG. 8 and consists of a pair of P-channel MOSFET Q1 and an N-channel MOSFET Q2. The gates of these MOSFETs connected commonly are used as the input terminal of the unit cell 17 and are connected to the X channel X3 through the input terminal outgoing line T17i, as described already. Their commonly connected drain is used as the output terminal of the unit cell UC17 and is connected to the X channel X14 through the output terminal outgoing line T17o.

As shown typically in FIG. 6, an N well region NW is disposed at the upper half portion of the device regions CG1–CG6 and a P type diffusion layer LP for forming the source S1 and drain D1 of the P channel MOSFET Q1 of the unit cell UC17 described above, for example, is formed in the N well region NW. The channel of MOSFET Q1 is formed between the source S1 and drain D1 described above and a polysilicon layer constituting the gate G1 is formed as the upper layer of the channel.

On the other hand, an N type diffusion layer LN for constituting the source S2 and drain D2 of the N channel MOSFET Q2, for example, of the unit cell UC 17 described above is formed at the lower half layer of the device regions CG1–CG6. The channel of MOSFET Q2 is formed between these source S2 and drain D2 and a polysilicon layer for forming the gate G2 is disposed as the upper layer of the channel.

The source S1 of MOSFET Q1 is connected to the second layer aluminum wiring layer AL2, that is, a power source supply line VCC, through the contact represented by mark □ and the through-hole represented by mark □, though it is not to be considered as being particularly limited thereto, and the source S2 of MOSFET Q2 is connected similarly to a ground potential supply line VSS. The drain D1 of MOSFET Q1 is connected commonly to the drain D2 of MOSFET Q2 through the first layer aluminum wiring layer AL1 and is then used as the output terminal outgoing line T17o, described already. The gate G1 of MOSFET Q1 is likewise connected commonly to the gate G2 of MOSFET Q2 through the first layer aluminum wiring layer AL1 and is then used as the input terminal outgoing line T17i described above. Incidentally, FIG. 6 shows the state where both of the output terminal outgoing line 17o and input terminal outgoing line T17i are cut in the cut region CUT2.

If any abnormality occurs during the fabrication process of the gate array integrated circuit and any trouble occurs in the unit cell UC17 of the device region CG1, for example, the input terminal outgoing line T17i and the output terminal outgoing line T17o of the unit cell UC17 are first cut in the cut region CUT2 by FIB or laser CVD and the cut-off processing of the unusable unit cell UC17 is conducted. A new contact C1 represented by mark □ is formed between the input terminal outgoing line T17i of the unit cell UC17 and the redundancy line XR1 and the output terminal outgoing line and redundancy line are connected. The redundancy line XR1 is connected further to the input terminal outgoing line TR2i of the redundancy cell UCR2 through a new contact c3. Similarly, the output terminal outgoing line T17o of the unit cell UC17 is connected to the redundancy line XR2 through a new contact C2 and further to the output terminal outgoing line TR2o of the redundancy cell UCR2 through a new contact C4.

As shown typically in FIG. 8, the redundancy cell UCR2 is formed as the CMOS inverter circuit in the same way as the unit cell UC17 and consists of a pair of a P channel MOSFET Q3 and N channel MOSFET Q4. Their gates which are connected in common are used as the input terminal of the redundancy cell UCR2 and are connected to the redundancy line XR1 through the input terminal outgoing line TR2i and the contact C3 as described above. Their drains which are connected in common are used as the output terminal of the redundancy cell UCR2 and are connected to the redundancy line XR2 through the output terminal outgoing line TR2o and the contact C4.

The sources S3, S4 and drains D3, D4 constituting these MOSFETs Q3, Q4 are accomplished by the P type diffusion layer LP formed inside the N well region NW of the device region CG1 as shown typically in FIG. 6 and the gates G3, G4 are accomplished by the polysilicon layer formed on the channel between the source S3 and the drain D3 or the source S4 and the drain D4.

The source S3 of MOSFET Q3 described above is connected to the second layer aluminum wiring layer AL2, that is, the power source voltage supply line VCC, through the corresponding contact and through-hole. The source S4 of MOSFET Q4 is similarly connected to the ground potential supply line VSS. The drain D3 of MOSFET Q3 is first connected commonly to the drain D4 of MOSFET Q4 through the first layer aluminum wiring layer AL1 and is then used as the output terminal outgoing line TR2o described above. The gate G3 of MOSFET Q3 is similarly connected commonly to the gate G4 of MOSFET Q4 through the first layer aluminum wiring AL1 and is then used as the input terminal outgoing line TR2i, described above.

Incidentally, the redundancy line XR2 is formed by use of the second layer aluminum wiring layer AL2 as shown in the A - B sectional line of FIG. 7, and the output terminal outgoing line T17o of the unit cell UC17 and the output terminal outgoing line TR2o of the redundancy cell UCR2 are formed by use of the first layer aluminum wiring layer AL1. A gate layer consisting of a polysilicon layer, which is not shown in the drawing, is formed as the lower layer of these outgoing lines and the N well region NW formed on the semiconductor substrate SUB and the buried layers such as a P type diffusion layer LP and an N type diffusion layer LN are formed as the lower layers of the gate layer. As represented by dotted lines in FIG. 7, the new contacts C2 and C4, that are formed between the redundancy line XR2 and the output terminal outgoing lines T17o and TR2o, are accomplished by applying FIB or laser CVD processing to the gap of the aluminum wiring layers forming them. As a result, the unit cell UC17 which becomes unusable is replaced by the redundancy cell UCR2 and consequently, normality of the function of the gate array integrated circuit can be maintained.

Incidentally, in FIG. 5, when the input terminal outgoing lines TR1i and TR2i of the redundancy cells UCR1 and UCR2 and their output terminal outgoing lines TR1o and TR2o are cut in the corresponding cut regions CUT2, the input terminal outgoing lines TR1i, TR2i and the output terminal outgoing lines TR1o, TR2o that are left in the wiring region CH1, and the like, can be used as the redundancy lines YR1, YR2 and YR3, YR4 shown in FIG. 1, respectively. Accordingly, abnormality of the connection lines occurring in the wiring region CH1 and the like can be relieved and normality of the function of the gate array integrated circuit can be maintained by using these outgoing lines and the redundancy lines XR1-XR4 in combination with one another. Such a defect relief method of the connection lines is exactly the same as that of the first embodiment and its explanation will be therefore omitted.

As described above, the gate array integrated circuit of this embodiment includes the device regions CG1-CG6 and the wiring regions CH1-CH5 disposed between these device regions. Among them, each of the device regions CG1-CG6 includes the twenty unit cells UC1-UC20 consisting of the CMOS gate circuit and a pair of redundancy logic devices, that is, the redundancy cells UCR1, UCR2 disposed at both ends of the device region, and each of the wiring regions CH1-CH5 includes a plurality of Y channels formed in the Y-axis direction and used as the input terminal or output terminal outgoing lines of each unit cell or each redundancy cell and a plurality of X channels formed in the X-axis direction and used as the lines between the devices. In this embodiment, two pairs of redundancy lines XR1, XR2 and XR3, XR4 are disposed in the X-axis direction between each wiring region and the pair of corresponding device regions so that they can be connected to, and cross, the input terminal or output terminal outgoing lines of the total 22 unit cells and redundancy cells, and the cut regions CUT1 are disposed between each pair of redundancy lines and the corresponding wiring regions in order to cut off those lines which become unusable and the cut regions CUT2 are disposed between each pair of redundancy lines and the corresponding device region in order to cut off the logic devices which become unusable, respectively. The lines which become unusable in each wiring region due to the short-circuit trouble, or the like, are cut off as the associated outgoing lines are cut off in the corresponding cut regions CUT1, and are then connected to the suitable redundancy lines XR1-XR4 through the new contacts which are formed by FIB or laser CVD, respectively. Similarly, the logic devices which become unusable in each device region are cut off as the associated outgoing lines are cut off in the corresponding cut regions CUT2, are then connected to the suitable redundancy lines XR1-XR4 through the new contacts and are thereafter replaced by the redundancy cell UCR1 or UCR2. Accordingly, abnormality that occurs in the device region or the wiring region during the fabrication process of the gate array integrated circuit or the like is remedied and normality of the function of the gate array integrated circuit can be maintained. As a result, the production yield of the gate array integrated circuit can be improved and the reduction of its production cost can be promoted.

Embodiment 3

Figure 9:
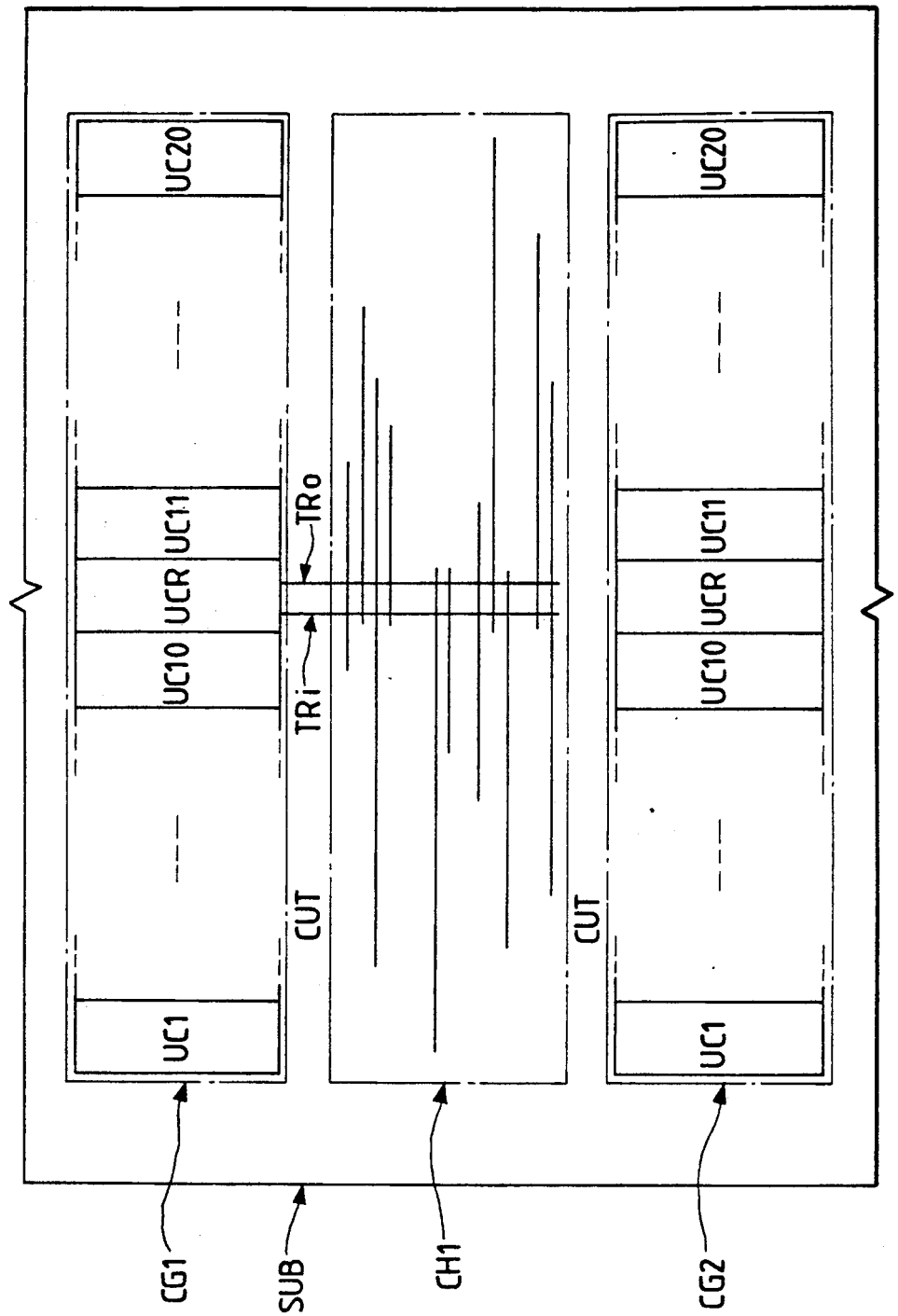
FIG. 9 is a partial enlarged arrangement view showing a third embodiment of the gate array integrated circuit to which the present invention is applied.
Figure 10:
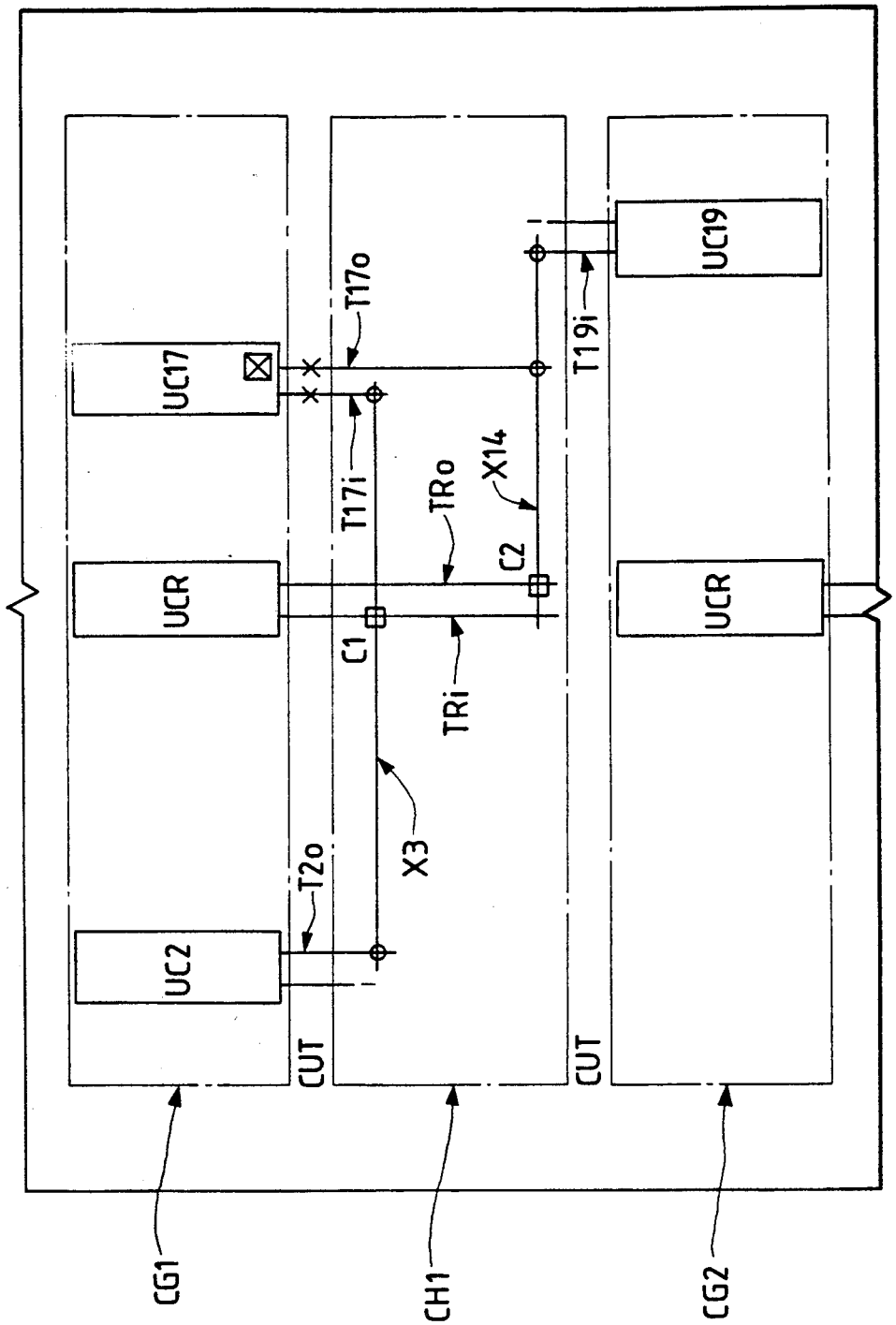
FIG. 10 is a wiring diagram showing an example of defect relief in the gate array integrated circuit shown in FIG. 9.

FIG. 9 is a partial enlarged arrangement view of the third embodiment of the gate array integrated circuit to which the present invention is applied. FIG. 10 is a wiring diagram useful for explaining an example of defect relief in the gate array integrated circuit shown in FIG. 9. The structure of the gate array integrated circuit of this embodiment and the outline and features of defect relief will be explained with reference to these drawings. Since the gate array integrated circuit of this embodiment is fundamentally the same as the second embodiment shown in FIG. 4, only the different portions will be explained additionally.

In FIG. 9 each of the six device regions CG1-CG6 disposed in the gate array integrated circuit of this embodiment includes twenty unit cells UC1-UC20 consisting of the CMOS logic gate circuit and one redundancy logic device or redundancy cell UCR disposed at their center as represented typically by the device regions CG1 and CG2. The input and output terminals of the unit cells UC1-UC20 of each device region are extended into the corresponding wiring regions CH1-CH5 through the outgoing lines that are formed in the vertical direction of the drawing or in other words, in the Y-axis direction (first coordinates axis) and are not shown in the drawing. The input and output terminals of the redundancy cell UCR are extended into the corresponding wiring regions CH1-CH5 through the similar input terminal outgoing lines TRi and output terminal outgoing lines TRo.

Each wiring region CH1-CH5 includes the Y channel (first channel) which is assumed in the vertical direction of FIG. 9 or in other words, in the Y-axis direction and the X channel (second channel) which is assumed in the horizontal direction or in other words, in the X-axis direction (second coordinates axis). Among them, the Y channel of each wiring region is composed of the first layer aluminum wiring layer AL1 and is used as the input terminal or output terminal outgoing line of the unit cell or redundancy cell. The X channel is composed of the second layer aluminum wiring layer AL2 and is used as the line between the devices which is for connecting a plurality of outgoing lines described above which correspond to a plurality of logic gate circuits to be connected logically. In this embodiment, all these lines between the devices are extended until they can be connected to, and cross, the input terminal outgoing line TRi and output terminal outgoing line TRo of the redundancy cell UCR as shown typically in FIG. 9. The cut regions CUT are disposed between the two device regions CG1 and CG2-CG5 and CG6 and the corresponding wiring regions CH1-CH6, respectively.

Next, the outline of the defect relief method of the logic devices in the gate array integrated circuit of this embodiment will be explained about the case of FIG. 10.

When no abnormality is observed in the gate array integrated circuit in FIG. 10, the output terminal outgoing line T2o of the unit cell UC2 of the device region CG1 is connected to the X channel X3 of the wiring region CH1 through the contact represented by small circle o and then to the input terminal outgoing line T17i of the unit cell UC17 of the same device region CG1 through a similar contact. This X channel X3 crosses the input terminal outgoing line TRi and output terminal outgoing line TRo of the redundancy cell UCR during its extension process. Similarly, the output terminal outgoing line T17o of the unit cell UC17 is connected to the X channel X14 of the wiring region CH1 and further to the input terminal outgoing line T19i of the unit cell UC19 of the device region CG2. As described already, this X channel X14 is extended in such a manner as to cross the input terminal outgoing line TRi and output terminal outgoing line TRo of the redundancy cell UCR.

If any abnormality occurs during the fabrication process of the gate array integrated circuit and any trouble occurs in the unit cell UC17 of the device region CG1, for example, the input terminal outgoing line T17i and output terminal outgoing line T17o are first cut in the cut region CUT by FIB or laser CVD as shown typically in FIG. 10 and the cut-off processing of the unusable unit cell UC17 is conducted. The new contact C1 and C2 represented by mark □ are formed between the X channel X3 and the input terminal outgoing line TRi of the redundancy cell UCR and between the X channel X14 and the output terminal outgoing line TRo of the redundancy cell UCR, respectively, and these X channel and outgoing lines are connected respectively. As a result, the unit cell UC17 that becomes unusable is replaced by the redundancy cell UCR and consequently, normality of the function of the gate array integrated circuit can be maintained.

As described above, the gate array integrated circuit of this embodiment includes the six device regions CG1-CG6 and the wiring regions CH1-CH5 disposed between these device regions. Among them, each of the device regions CG1-CG6 includes the twenty unit cells UC1-UC20 consisting of the CMOS logical gate circuit and one redundancy logic device or in other words, the redundancy cell UCR, disposed at their center and each of the wiring regions CH1-CH5 includes a plurality of Y channels formed in the Y-axis direction and used as the input terminal or output terminal outgoing lines and a plurality of X channels formed in the X-axis direction and used as the lines between the devices. In this embodiment, all the lines between the devices disposed in each wiring region are extended in such a manner as to be capable of crossing the input terminal and output terminal outgoing lines of the redundancy cell UCR. The cut regions CUT for cutting off the logical device which becomes unusable are disposed between each wiring region and the two corresponding device regions, respectively. The logical devices which become unusable in each device region are cut off when the associated outgoing lines are cut off in the corresponding cut regions CUT and are replaced by the redundancy cell UCR when the X channels are connected to the input terminal or output terminal outgoing lines of the redundancy cell UCR through the contacts that are formed afresh by FIB or laser CVD. In this manner, abnormality occurring in any device region during the fabrication process is remedied and normality of the function of the gate array integrated circuit can be maintained. As a result, the production yield of the gate array integrated circuit can be improved and the reduction of the production cost can be promoted.

Incidentally, in the gate array integrated circuit of this embodiment, the redundancy cell UCR is disposed at the center of each device region and all the lines between the devices which are disposed in the wiring regions are formed in such a manner as to cross, and to be capable of being connected to, the input terminal and output terminal outgoing lines of the redundancy cell UCR. According to this arrangement, substitution between all the logic devices disposed in each device region and the redundancy cells becomes possible without disposing the redundancy lines.

As represented by a plurality of embodiments given above, when the present invention is applied to a semiconductor integrated circuit device such as the gate array integrated circuit, or the like, the present invention can provide the following function and effects.

(1) When the redundancy lines which are used selectively in place of the lines which become unusable in the semiconductor integrated circuit device such as the gate array integrated circuit or the like, the lines which become unusable due to abnormality during the fabrication process of the gate array integrated circuit or the like can be replaced by the redundancy lines and normality of the function of the gate array integrated circuit can be maintained.

(2) When two redundancy lines are disposed as a unit to form a pair in the item (1) described above, the short-circuit trouble between the adjacent lines, which has a relatively high probability of occurrence, can be relieved easily.

(3) When the cut region for cutting off the unusable lines is disposed between each pair of redundancy lines and the corresponding wiring region in the items (1) and (2) described above, the cut processing of the outgoing lines and their connection processing can be made efficiently.

(4) When the redundancy lines are disposed between each wiring region and the corresponding device region and are formed in such a manner as to cross and be capable of being connected to, all the corresponding input terminal or output terminal outgoing lines in the items (1)–(3) described above the connection processing between each outgoing line and the redundancy line can be made efficiently.

(5) In the items (1)–(4) described above when another pair of redundancy lines are formed in such a manner as to cross orthogonally a pair of redundancy lines disposed so as to sandwich each wiring region and in such a manner as to be capable of being connected to these redundancy lines, defect relief of the lines formed so as to extend to these two device regions can be accomplished.

(6) In the items (1)–(5) described above, when the cut-off processing and the connection processing of the outgoing line, the redundancy line, etc., are carried out by FIB or laser CVD, defect relief of the gate array integrated circuit, etc., that has already been formed on the wafer can be accomplished efficiently.

(7) When the redundancy logic devices which are used selectively in place of the unusable logic devices are disposed in the semiconductor integrated circuit device such as the gate array integrated circuit etc., the logical devices which become unusable due to abnormality during the fabrication process of the gate array integrated circuit or the like can be replaced by the redundancy logic devices and normality of the function of the gate array integrated circuit can be maintained.

(8) When the redundancy lines are disposed between each wiring region and the corresponding device regions in such a manner as to cross, and be capable of being connected to, all the corresponding input terminal or output terminal outgoing lines, in the item (7) described above, the connection processing between each outgoing line and the redundancy line and each outgoing line and the redundancy logic device can be made efficiently.

(9) In the items (7) and (8) described above, the redundancy logic device is disposed at one of the ends, or both ends, of the device region and the input terminal and output terminal outgoing lines of each redundancy logic device are disposed in such a manner as to cross, and be capable of being connected to, the pair of redundancy lines disposed while sandwiching the corresponding wiring regions. In this manner, defect relief of the trouble briding over two device regions can be conducted efficiently.

(10) In the items (7)–(9) described above, when the redundancy lines and the input terminal and output terminal outgoing lines of the redundancy logic devices are used in place of the lines which become unusable due to the trouble during the production process of the gate array integrated circuit, or the like, defect relief of the lines can be accomplished simultaneously.

(11) In the items (7)–(10) described above, the cut regions for cutting the unusable logic devices or the lines are disposed between each redundancy line and the corresponding device and wiring regions, respectively. In this manner, the cut-off processing and connection processing of the outgoing lines can be made efficiently.

(12) In the item (7) described above, the input terminal and output terminal outgoing lines of each redundancy logic device are disposed in the cross form so as to be capable of being connected to all the wirings between the devices that are disposed in the corresponding wiring regions. In this manner, the trouble of all the logic devices disposed in the device regions can be relieved without disposing the redundancy lines between the wiring regions and the device regions.

(13) Due to the effects of the items (1)–(12), the production yield of the gate array integrated circuit or the like can be improved and the reduction of its production cost can be promoted.

Although the present invention completed by the present inventors has thus been described definitely with reference to the embodiments thereof, the present invention is not particularly limited thereto but can of course be changed or modified in various ways without departing from the scope thereof. For example, as shown FIG. 1 each redundancy line need not particularly form a pair and may be disposed only one side of each wiring region. The number of dispositions of the unit cells, the redundancy logic devices and redundancy lines disposed in each device region and the positions of their dispositions are arbitrary and this also holds true of FIGS. 4 and 9. In FIGS. 1 and 4, the redundancy lines XR3 and XR4 need not be disposed so long as all the input terminal and output terminal outgoing lines corresponding to the device regions on the lower side, for example, can be extended till they cross the redundancy lines XR1 and XR2. In each of the diffusion disposition views, the cut regions CUT, CUT1 and CUT2 are not essentially necessary. In FIGS. 2, 3, 5 and 10, various methods can be employed in order to replace those lines and logic devices which become unusable by the redundancy lines and redundancy logic devices, respectively.

Figure 11:
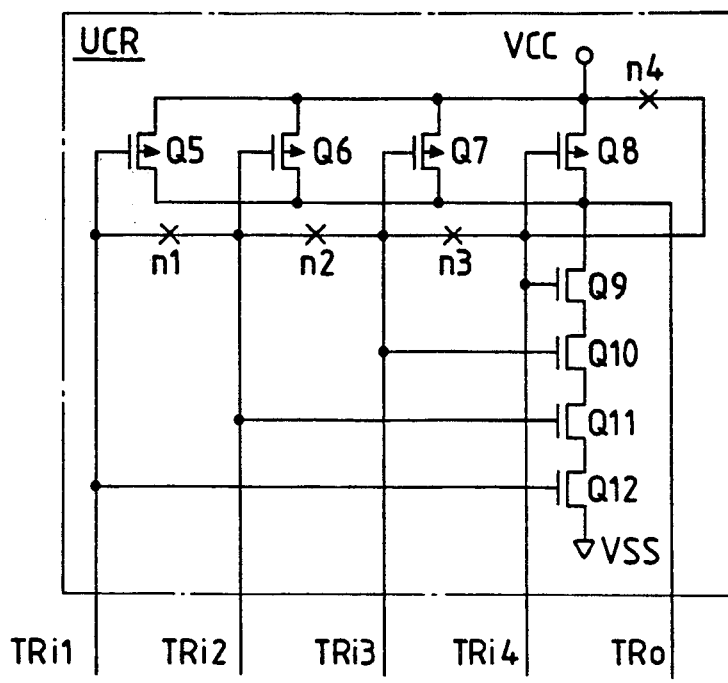
FIG. 11 is a circuit diagram showing a second embodiment of the redundancy logic device contained in the gate array integrated circuit to which the present invention is applied.
Figure 12:
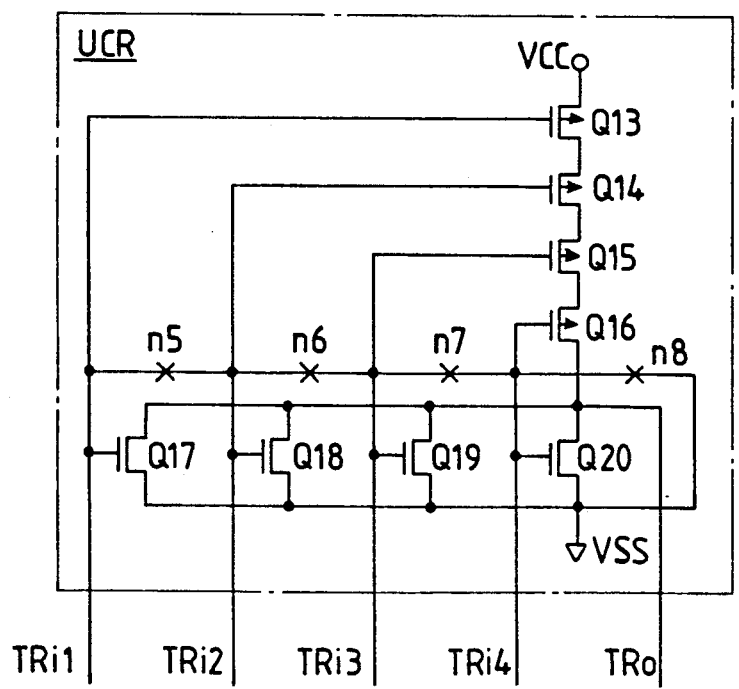
FIG. 12 is a circuit diagram showing a third embodiment of the redundancy logic device contained in the gate array integrated circuit to which the present invention is applied.

If various logic gate circuits other than the inverter circuit are contained in each device region, the redundancy logic devices or in other words, the redundancy cells, such as those shown in FIGS. 11 and 12 may be used in combination. In the case of FIG. 11, for example, the redundancy cell UCR consists basically of a 4-input NAND gate circuit consisting of P-channel MOSFETs Q5–Q8 and N-channel MOSFETs Q9–Q12 and its input nodes are connected in common to the power source voltage VCC of the circuit through four cut-off nodes n1–n4. These cut-off nodes are cut off in the numerical order in the necessary number in accordance with the circuit form of the logic devices which become unusable, so that the inverter circuit or 2-input or 4-input NAND gate can be accomplished efficiently on the basis of one redundancy logic device. On the other hand, in the case of FIG. 12, the redundancy cell UCR comprises a 4-input NOR gate circuit consisting of P-channel MOSFETs Q13-Q16 and N-channel MOSFETs Q17-Q20 and the input nodes are connected in common to the ground potential VSS of the circuit through four cut-off nodes n5-n8. These cut-off nodes are cut off in the numerical order and in the necessary number in accordance with the circuit form of the logic devices which become unusable, so that the inverter circuit and the 2-input or 4-input NOR gate circuit can be accomplished efficiently on the basis of one redundancy logic device.

Figure 14:
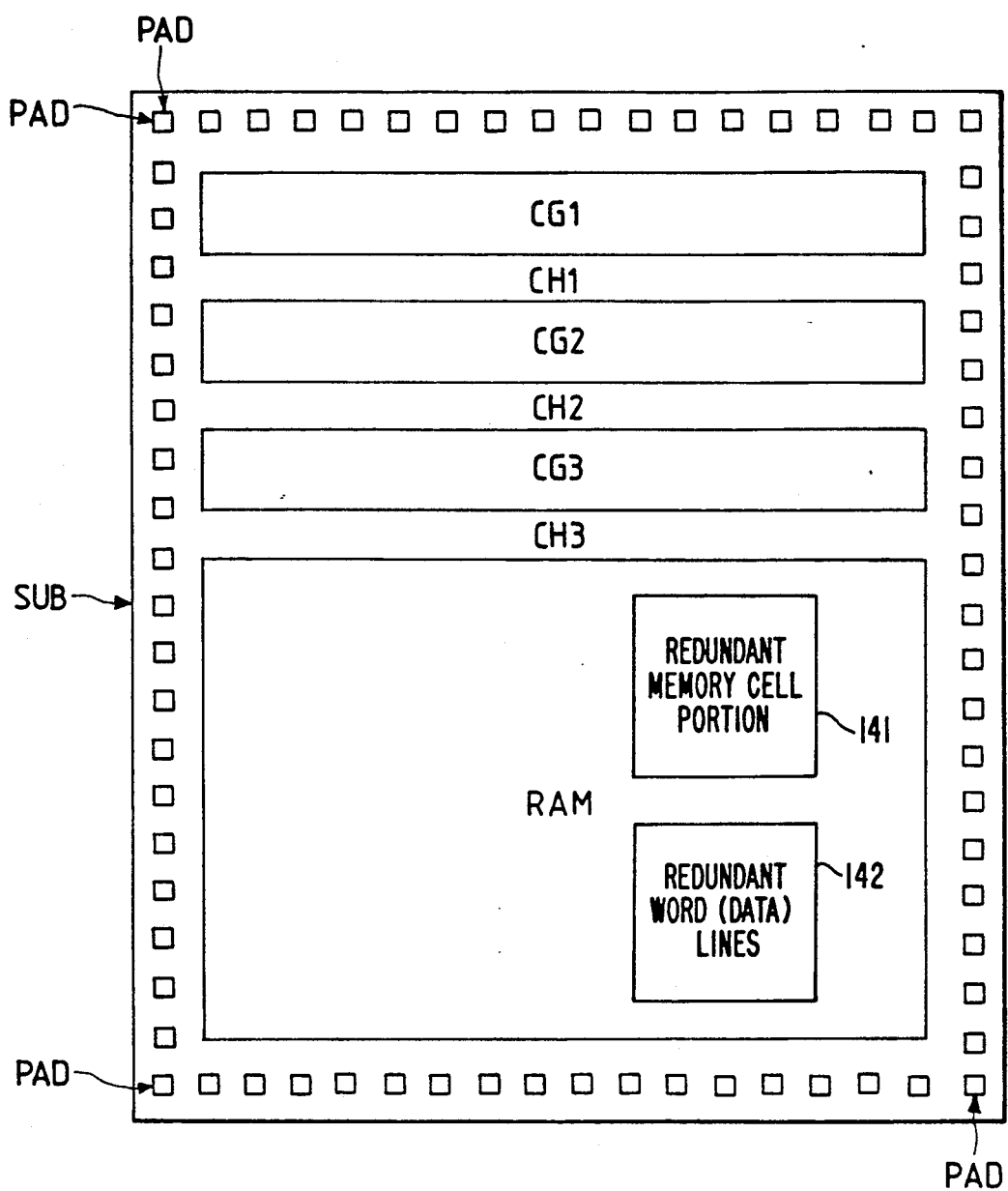
FIG. 14 is a substrate arrangement view showing a second embodiment of the gate array integrated circuit to which the present invention is applied.

In FIG. 13, the gate array integrated circuit may be of the type onto which one or a plurality of random access memories RAM formed as a macro-cell are mounted as shown in FIG. 14, for example. When these random access memories have the defect relief function through the provision of a redundant memory cell portion 141 or, in other words, when they include the redundancy word lines or redundancy data lines 142 which are used selectively in place of the word lines or data lines which become unusable, the technical significance that the redundancy lines and the redundancy logic devices are disposed in the logic portion, that is, in the device regions CG1-CG3 and the wiring regions CH1-CH3, becomes further greater.

Furthermore, in FIGS. 6 and 7, the gate array integrated circuit may be equipped with three or more aluminum wiring layers or may use metallic wiring layers other than the aluminum wiring layers. The definite construction of each logic device is not particularly limited by these embodiments and it may comprise bipolar transistors or a bipolar-CMOS composite logic circuit. Techniques other than FIB and laser CVD can be used for the cut and connection processing of the outgoing lines, and the like.

Although the invention completed by the present inventor has primarily been described with reference to the gate array integrated circuit as the background and field of utilization of the invention, the present invention is not particularly limited to the gate array integrated circuit but can be applied to various logic integrated circuit devices such as a memory equipped with the logic function and a microprocessor. The present invention can be applied broadly to semiconductor integrated circuit devices having at least a logic portion or to semiconductor integrated circuit devices requiring defect relief of lines.

The typical effects obtained by the typical invention among those disclosed in this application is briefly as follows. Since the redundancy logic devices and redundancy lines which are used selectively in place of the unusable logic devices or lines are disposed in the logic portion of the semiconductor integrated circuit device such as the gate array integrated circuit, the logic devices and lines which become unusable due to the trouble during the fabrication process of the gate array integrated circuit or the like can be replaced by the redundancy logic devices and the redundancy lines, respectively, and normality of the function as the logic portion can be maintained. As a result, the production yield of the semiconductor integrated circuit device can be improved and the reduction of its cost of production can be promoted.

What is claimed is:

1. In a semiconductor integrated circuit device including a gate array or memory with a gate array, the improvement comprising:

an arrangement of unit logic cells formed on a main plane of a single semiconductor substrate, wherein said arrangement is comprised of at least first and second plurality of logic cells formed in first and second gate regions, respectively, and wherein said first and second plurality of logic cells respectively include a predetermined number of unit logic cells and at least one redundancy cell, each unit logic cell is comprised of a logic gate circuit and each redundancy cell is provided for replacing a defective unit logic cell in a corresponding one of said first and second gate regions;

a wiring region disposed to overlie the main plane of said semiconductor substrate between said first and second gate regions, wherein said wiring region includes lines formed for connecting mutually logic gate circuits of predetermined unit logic cells from among said first and second gate regions; and a region overlying the main plane of said semiconductor substrate in which redundancy lines are formed, wherein said redundancy lines provided outside said wiring region are used to replace electrical connections to a defective unit logic cell with that of a redundancy cell, and wherein a defective unit logic cell in one of said first and second gate regions, which is electrically connected to a unit logic cell in the other of said first and second gate regions, via lines in said wiring region, is replaced by a redundancy cell in said one of said first and second gate regions without requiring a change in line connections through replacing of said lines in said wiring region.

2. A semiconductor integrated circuit device according to claim 1, wherein said lines in said wiring region include a group of first lines extending in a first coordinates axis direction and a group of second lines extending in a second coordinates axis direction crossing orthogonally said first coordinates axis, wherein each of said lines constituting said first line group is connected to an input terminal or output terminal of a corresponding one of said logic gate circuits and each of said lines constituting said second line group is connected to a plurality of lines constituting said first line group, and wherein in each of said first and second gate regions the logic cells thereof are arranged as a single row in said second coordinates axis direction.

3. A semiconductor integrated circuit device according to claim 2, wherein said redundancy lines are comprised of:

first redundancy lines which extend in said second coordinates axis direction.

4. A semiconductor integrated circuit device according to claim 3, wherein said first redundancy lines are extended to orthogonally cross said first line group.

5. A semiconductor integrated circuit device according to claim 4, wherein each said redundancy cell has input and output for connection to outgoing lines extending in said first coordinates axis direction, and wherein said outgoing lines are used in place of defective ones of said lines constituting said first line group.

6. A semiconductor integrated circuit device according to claim 5, wherein said outgoing lines orthogonally cross said first redundancy lines.

7. A semiconductor integrated circuit device according to claim 6, wherein the main plane of said single semiconductor substrate further comprises:

a plurality of logic gate circuit regions; and
a plurality of said wiring regions, wherein each one of said logic gate circuit regions is disposed as a single row of logic cells including said predetermined number of unit logic cells and at least one redundant cell, wherein consecutive rows of logic cells are spaced-apart and have interposed between them a respective one of said wiring regions, wherein between each row of logic cells and corresponding wiring region a further region is included in which redundancy lines are formed, and wherein each redundancy wiring region includes at least one first redundancy line extending in said second coordinates axis direction for use in replacing a defective unit logic cell with a corresponding redundant cell.

8. In a semiconductor integrated circuit device including a gate array or memory with a gate array, the improvement comprising:

an arrangement of unit logic cells formed on a main plane of a single semiconductor substrate, wherein said arrangement is comprised of at least first and second plurality of logic cells formed in first and second gate regions, respectively, and said first and second plurality of logic cells respectively include a predetermined number of unit logic cells and at least one redundancy cell, wherein each unit logic cell is comprised of a logic gate circuit and each redundancy cell, provided for replacing a defective unit logic cell in a corresponding one of said first and second gate regions, is adapted to be logically configured to a logic function of any defective unit logic cell it replaces;

a wiring region disposed to overlie the main plane of said semiconductor substrate between said first and second gate regions, wherein said wiring region includes lines formed for connecting mutually logic gate circuits of predetermined unit logic cells from among said first and second gate regions; and a region overlying the main plane of said semiconductor substrate in which redundancy lines are formed, wherein said redundancy lines provided outside said wiring region are used to replace electrical connections to a defective unit logic cell with that of a redundancy cell, and wherein a defective unit logic cell in one of said first and second gate regions, which is electrically connected to a unit logic cell in the other of said first and second gate regions, via lines in said wiring region, is replaced by a redundancy cell in said one of said first and second gate regions without requiring a change in line connections through replacing of said lines in said wiring region.

9. A semiconductor integrated circuit device according to claim 8, wherein each redundant cell is adapted to the logic function of the unit logic cell it replaces by cutting off preexisting nodal connections therein.

10. A semiconductor integrated circuit device according to claim 8, wherein said lines in said wiring region include a group of first lines extending in a first coordinates axis direction and a group of second lines extending in a second coordinates axis direction crossing orthogonally said first coordinates axis direction, wherein each of the lines constituting said first line group is connected to an input terminal or output terminal of a corresponding one of said logic gate circuits and each of the lines constituting said second line group is connected to a plurality of liens constituting said first line group.

11. A semiconductor integrated circuit device according to claim 10, wherein said redundancy lines are comprised of:

first redundancy lines which are extended in said second coordinates axis direction.

12. A semiconductor integrated circuit device according to claim 11, wherein said first redundancy lines are extended to orthogonally cross said first line group.

13. A semiconductor integrated circuit device according to claim 12, wherein said redundancy lines further include:

second redundancy lines extending in said first coordinates axis direction and connected to an input terminal or output terminal of said at least one redundancy logic gate circuit.

14. A semiconductor integrated circuit device according to claim 13, wherein said second redundancy lines are extended to orthogonally cross said first lines.

15. A semiconductor integrated circuit device according to claim 8, wherein said memory is equipped with a redundancy word line or redundancy data line to be used in place of a defective word or data line, said memory is disposed at a different area on the main plane of said single semiconductor substrate than that of said gate array.

16. A semiconductor integrated circuit device according to claim 8 wherein said memory is equipped with a redundancy memory cell to be used in place of a defective memory cell, said memory is disposed at a different area of the main plane on said single semiconductor substrate than that of said gate array.

17. A semiconductor integrated circuit device according to claim 23, wherein said arrangement of unit logic cells is comprised of a plurality of rows of logic cells formed in respective ones of plural gate regions, each row of logic cells includes said predetermined number of unit logic cells and said at least one redundancy cell, wherein said wiring region is disposed as plural wiring regions overlying the main surface of said semiconductor substrate, said plural wiring regions are respectively interposed at spacings between consecutively arrayed rows of logic cells, and each of said plural wiring regions includes first lines extending in a first coordinates axis direction, orthogonal to the direction of the rows of logic cells, formed for connecting mutually logic gate circuits of predetermined unit logic cells from among said plurality of rows of logic cells, wherein said region in which said redundancy lines are formed is comprised of plural redundancy wiring regions respectively interposed between each row of logic cells and a corresponding wiring region, and wherein each redundancy wiring region includes at least one first redundancy line extending in a second coordinates axis direction, orthogonal to said first coordinates axis direction, for use in replacing a defective unit logic cell with a redundant cell corresponding to the same row of cells.

18. A semiconductor integrated circuit device according to claim 17, wherein said memory is equipped with a redundancy memory cell to be used in place of a defective memory cell, said memory is disposed at a different area on the main plane of said single semiconductor substrate than that of said gate array.

19. A semiconductor integrated circuit device according to claim 18, wherein each of said plural wiring regions further includes second lines extending in said second coordinates axis direction crossing plural ones of said first lines.

20. A semiconductor integrated circuit device according to claim 15, wherein said at least first and second plurality of logic cells are comprised as an array of at least first and second rows of logic cells.

21. A semiconductor integrated circuit device according to claim 10, wherein each one of said at least first and second plurality of logic cells is arranged as a single row in said second coordinates axis direction.

* * * * *